(12) United States Patent
Kim

(10) Patent No.: US 12,538,663 B2
(45) Date of Patent: Jan. 27, 2026

(54) ELECTROLUMINESCENT DISPLAY DEVICE

(71) Applicant: LG Display Co., Ltd., Seoul (KR)

(72) Inventor: Hanil Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 569 days.

(21) Appl. No.: 18/063,648

(22) Filed: Dec. 8, 2022

(65) Prior Publication Data

US 2023/0187557 A1    Jun. 15, 2023

(30) Foreign Application Priority Data

Dec. 14, 2021  (KR) .................. 10-2021-0178517

(51) Int. Cl.
*H10K 59/122*  (2023.01)
*H10K 59/124*  (2023.01)
*H10K 59/126*  (2023.01)
*H10K 102/00*  (2023.01)

(52) U.S. Cl.
CPC ......... *H10K 59/122* (2023.02); *H10K 59/124* (2023.02); *H10K 59/126* (2023.02); *H10K 2102/311* (2023.02)

(58) Field of Classification Search
CPC ... H10K 59/122; H10K 59/124; H10K 59/126
See application file for complete search history.

(56) References Cited

U.S. PATENT DOCUMENTS

| | | |
|---|---|---|
| 2015/0048361 A1 | 2/2015 | Yamakita et al. |
| 2019/0140212 A1 | 5/2019 | Park et al. |
| 2023/0035664 A1 | 2/2023 | An et al. |
| 2023/0189578 A1* | 6/2023 | Cha ................... H10K 59/1213 257/40 |

FOREIGN PATENT DOCUMENTS

| | | |
|---|---|---|
| KR | 10-2014-0083852 A | 7/2014 |
| KR | 20150015237 A | 2/2015 |
| KR | 10-1976832 B1 | 5/2019 |
| KR | 20190076152 A | 7/2019 |
| KR | 20200054734 A | 5/2020 |
| KR | 10-2020-0082752 A | 7/2020 |
| KR | 20210084835 A | 7/2021 |
| WO | WO 2021115131 A1 | 6/2021 |

* cited by examiner

*Primary Examiner* — Daniel P Shook
(74) *Attorney, Agent, or Firm* — Seed Intellectual Property Law Group LLP

(57) ABSTRACT

An electroluminescent display device according to an example embodiment of the present disclosure may include a substrate having an active area and a non-active area, an oxide thin film transistor disposed on the substrate, an inorganic layer disposed on the oxide thin film transistor, an organic layer disposed on the inorganic layer, at least one hole disposed in the organic layer of the non-active area, a hydrogen blocking layer disposed on the organic layer and an inner surface of the hole and a light emitting element disposed on the organic layer and including an anode, a light emitting unit, and a cathode. As a result, characteristics and reliability of the thin film transistor can be improved by preventing hydrogen from flowing into the oxide thin film transistor.

21 Claims, 12 Drawing Sheets

ELECTROLUMINESCENT DISPLAY DEVICE

CROSS-REFERENCE TO RELATED APPLICATIONS

This application claims the benefit of and priority to Korean Patent Application No. 10-2021-0178517 filed on Dec. 14, 2021 in the Republic of Korea, the entire contents of which are hereby expressly incorporated by reference into the present application.

BACKGROUND

Technical Field

The present disclosure relates to an electroluminescent display device, and more particularly, to an electroluminescent display device using an oxide thin film transistor.

Description of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Representative display devices include a liquid crystal display device (LCD), an electro-wetting display device (EWD), an organic light emitting display device (OLED), and the like.

Among these various display devices, an electroluminescent display device including an organic light emitting display device is a self-light emitting display device, and can be manufactured to be light and thin since it does not require a separate light source, unlike a liquid crystal display device having a separate light source. In addition, the electroluminescent display device has advantages in terms of power consumption due to a low voltage driving, and is excellent in terms of a color implementation, a response speed, a viewing angle, and a contrast ratio (CR). Therefore, electroluminescent display devices are expected to be utilized in various fields.

The electroluminescent display device is constructed by disposing a light emitting layer using an organic material between two electrodes that are referred to as an anode and a cathode. Then, when holes from the anode are injected into the light emitting layer and electrons from the cathode are injected into the light emitting layer, the injected electrons and holes recombine with each other to form excitons in the light emitting layer and emit light.

BRIEF SUMMARY

An aspect of the present disclosure is to provide an electroluminescent display device that prevents an inflow of hydrogen into an oxide thin film transistor.

Technical benefits of the present disclosure are not limited to the above-mentioned technical benefits, and other technical benefits, which are not mentioned above, can be clearly understood by those skilled in the art from the following descriptions.

An electroluminescent display device according to an example embodiment of the present disclosure includes a substrate divided into an active area and a non-active area, an oxide thin film transistor disposed on the substrate, an inorganic layer disposed on the oxide thin film transistor, an organic layer disposed on the inorganic layer, at least one hole disposed in the organic layer of the non-active area, a hydrogen blocking layer disposed on the organic layer and an inner surface of the hole and a light emitting element disposed on the organic layer and including an anode, a light emitting structure, and a cathode.

An electroluminescent display device according to another example embodiment of the present disclosure includes a substrate including an active area and a non-active area, an oxide thin film transistor disposed on the substrate in the active area, an inorganic layer disposed on the oxide thin film transistor, an organic layer disposed on the inorganic layer, a hydrogen blocking layer disposed in the organic layer of the non-active area, a light emitting element disposed on the organic layer and including an anode, a light emitting structure, and a cathode and an encapsulation layer disposed on the light emitting element, wherein the hydrogen blocking layer is positioned inwardly from an end of the light emitting structure to block hydrogen that is generated in the encapsulation layer from diffusing toward the active area through the end of the light emitting structure.

Other detailed matters of the example embodiments are included in the detailed description and the drawings.

According to the present disclosure, an inflow of hydrogen into an oxide thin film transistor is blocked by forming a hydrogen blocking layer between a gate in panel (GIP) and an active area, so that characteristics and reliability of the thin film transistor can be improved.

The effects according to the present disclosure are not limited to the contents exemplified above, and more various effects are included in the present specification.

DETAILED DESCRIPTION

Figure 1:
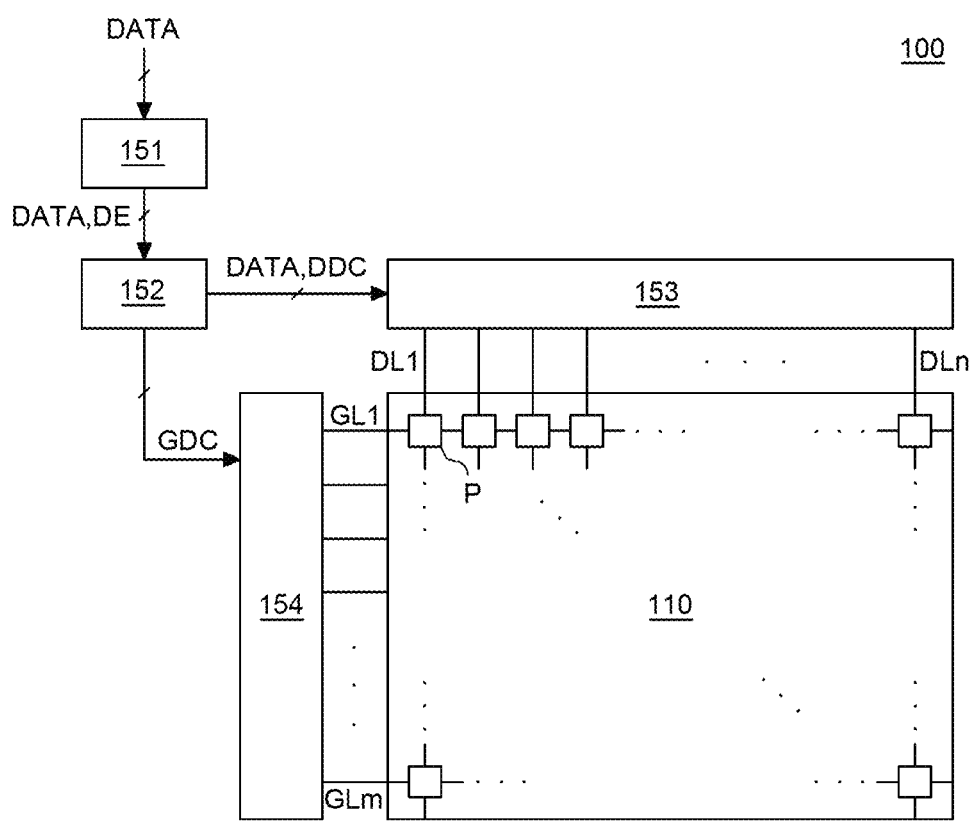
FIG. 1 is a block diagram of an electroluminescent display device according to a first example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, example embodiments of the present disclosure will be described in detail with reference to accompanying drawings.

FIG. 1 is a block diagram of an electroluminescent display device according to a first example embodiment of the present disclosure.

Referring to FIG. 1, an electroluminescent display device 100 according to the first example embodiment of the present disclosure may include an image processor 151, a timing controller 152, a data driver 153, a gate driver 154, and a display panel 110.

The image processor 151 may output a data signal DATA and a data enable signal DE through a data signal DATA supplied from the outside.

The image processor 151 may output one or more of a vertical synchronization signal, a horizontal synchronization signal, and a clock signal in addition to the data enable signal DE.

The timing controller 152 receives the data signal DATA together with the data enable signal DE or driving signals including the vertical synchronization signal, the horizontal synchronization signal, and the clock signal from the image processor 151. The timing controller 152 may output a gate timing control signal GDC for controlling an operation timing of the gate driver 154 and a data timing control signal DDC for controlling an operation timing of the data driver 153 based on the driving signals.

The data driver 153 samples and latches the data signal DATA supplied from the timing controller 152 in response to the data timing control signal DDC supplied from the timing controller 152, and converts the data signal DATA into a gamma reference voltage to thereby output it. The data driver 153 may output the data signal DATA through data lines DL1 to DLn.

The gate driver 154 may output a gate signal while shifting a level of the gate voltage in response to the gate timing control signal GDC supplied from the timing controller 152. The gate driver 154 may output the gate signal through gate lines GL1 to GLm.

The display panel 110 may display an image while sub-pixels P emit light in response to the data signal DATA and the gate signal supplied from the data driver 153 and the gate driver 154. A detailed structure of the sub-pixel P will be described in detail in FIG. 2 and FIG. 5.

Figure 2:
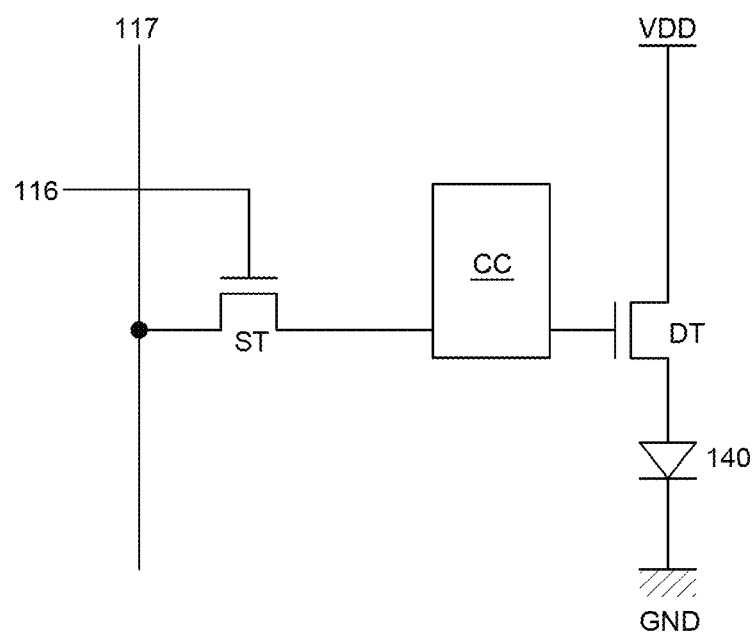
FIG. 2 is a circuit diagram of a sub-pixel of the electroluminescence display device according to the first example embodiment of the present disclosure.

FIG. 2 is a circuit diagram of a sub-pixel included in the electroluminescent display device according to the first example embodiment of the present disclosure.

Referring to FIG. 2, the sub-pixel of the electroluminescent display device 100 according to the first example embodiment of the present disclosure may include a switching transistor ST, a driving transistor DT, a compensation circuit CC, and a light emitting element 140.

The light emitting element 140 may operate to emit light according to a driving current that is formed by the driving transistor DT.

The switching transistor ST may perform a switching operation such that a data signal supplied through a data line 117 in response to the gate signal supplied through a gate line 116 is stored as a data voltage in a capacitor.

The driving transistor DT may operate such that a constant driving current flows between a high potential power line VDD and a low potential power line GND in response to the data voltage stored in the capacitor.

The compensation circuit CC is a circuit for compensating for a threshold voltage or the like of the driving transistor DT, and the compensation circuit CC may include one or more thin film transistors and capacitors. A configuration of the compensation circuit CC may vary according to a compensation method.

It is illustrated that the sub-pixel shown in FIG. 2 is configured to have a 2T(Transistor)1C(Capacitor) structure including the switching transistor ST, the driving transistor DT, the capacitor, and the light emitting element 140.

However, the sub-pixel may have various structures, such as 3T1C, 4T2C, 5T2C, 6T1C, 6T2C, 7T1C and 7T2C structures when the compensation circuit CC is added thereto.

Figure 3:
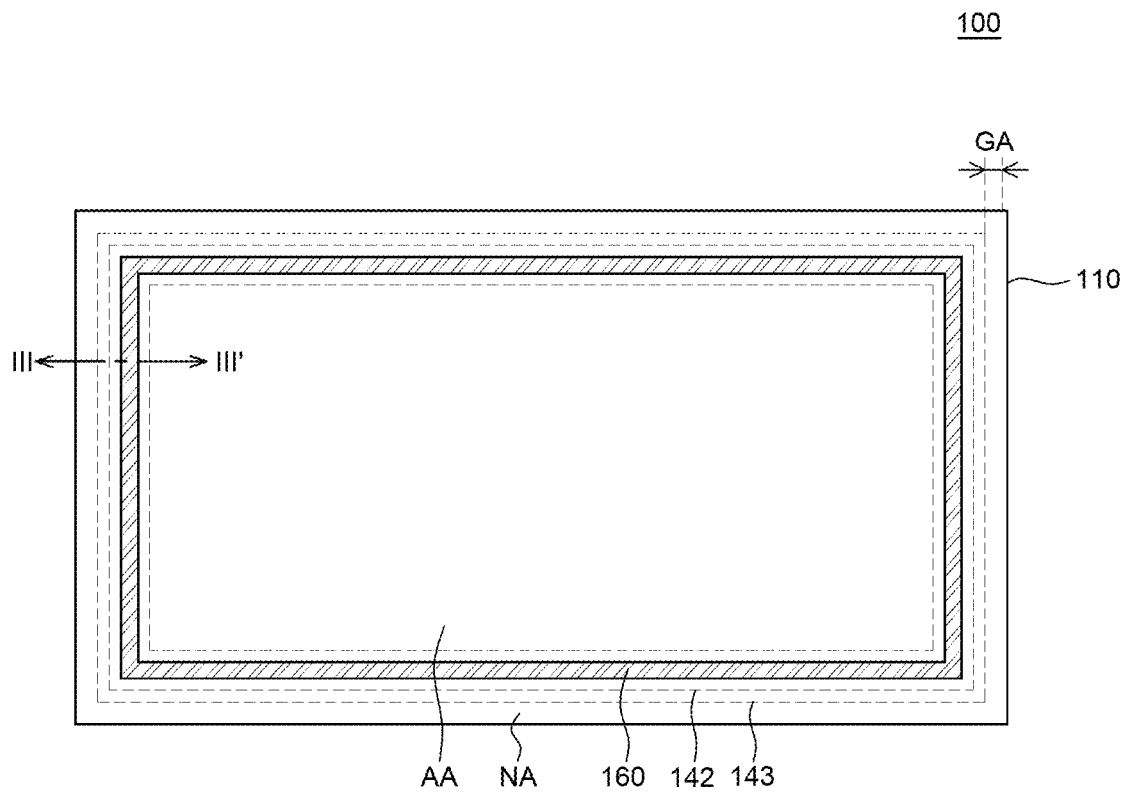
FIG. 3 is a plan view of the electroluminescent display device according to the first example embodiment of the present disclosure.

FIG. 3 is a plan view of the electroluminescent display device according to the first example embodiment of the present disclosure.

Figure 4:
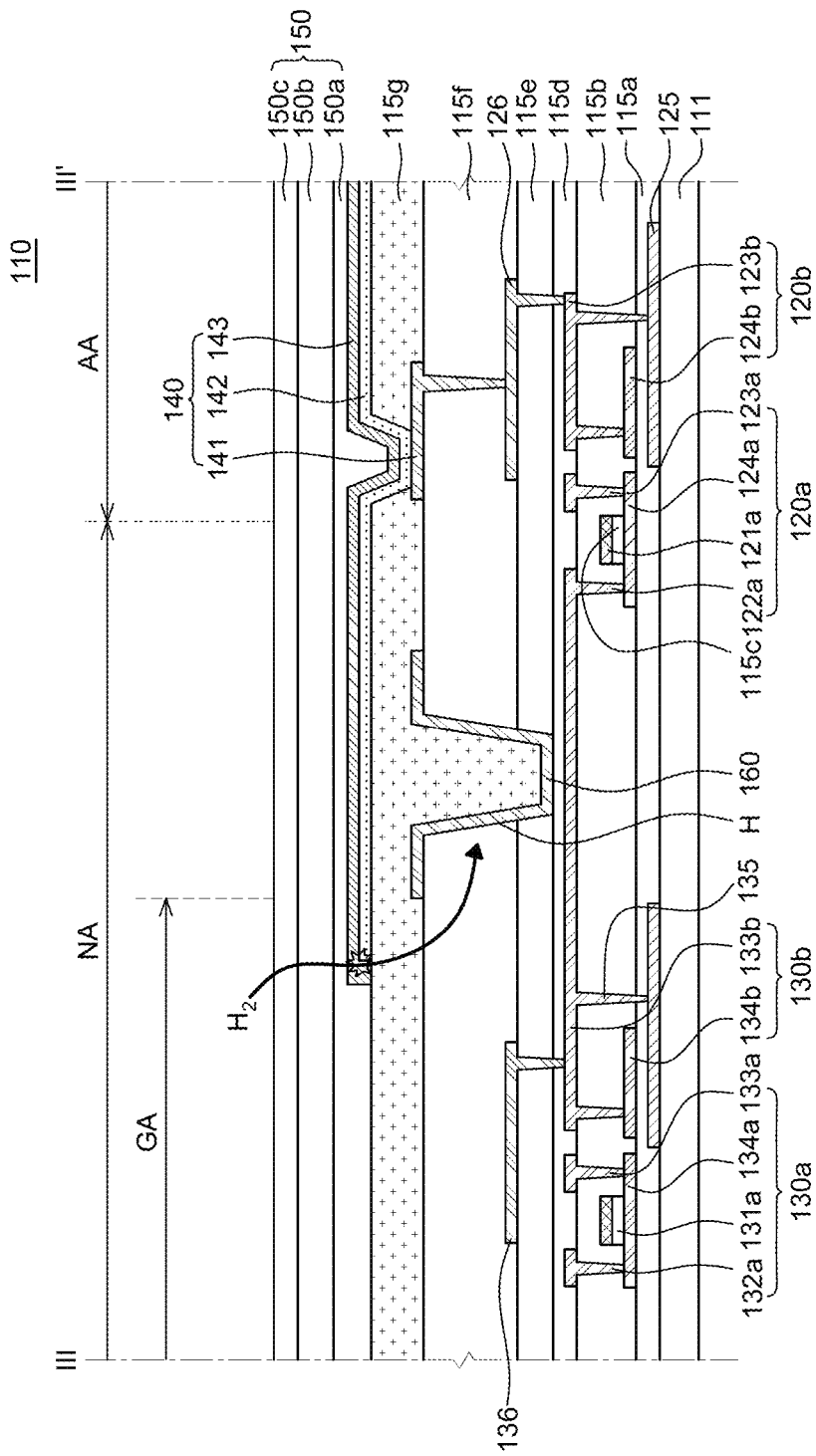
FIG. 4 is a cross-sectional view taken along line III-III' of FIG. 3.

FIG. 4 is a cross-sectional view taken along line III-III' of FIG. 3.

FIG. 4 illustrates a cross-section of the display panel 110 according to the first example embodiment including a portion of a gate in panel (GIP).

Referring to FIG. 3, the electroluminescent display device 100 according to the first example embodiment of the present disclosure may include the display panel 110, flexible films, and a printed circuit board.

The display panel 110 is a panel for displaying an image to a user.

In the display panel 110, display elements for displaying an image, a driving element for driving the display elements, and lines for transmitting various signals to the display elements and the driving element may be disposed. The display element may be configured differently according to a type of the display panel 110. For example, when the display panel 110 is an organic light emitting display panel, the display element is an organic light emitting element including an anode, an organic light emitting layer, and a cathode.

Hereinafter, it is described assuming that the display panel 110 is an organic light emitting display panel, but the display panel 110 is not limited to the organic light emitting display panel.

The display panel 110 may include an active area AA and a non-active area NA.

The active area AA is an area in which an image is displayed on the display panel 110.

A plurality of sub-pixels constituting a plurality of pixels and a circuit for driving the plurality of sub-pixels may be disposed in the active area AA. The plurality of sub-pixels are minimum units constituting the active area AA, and the display element may be disposed in each of the plurality of sub-pixels, and the plurality of sub-pixels may constitute the pixel. For example, an organic light emitting element including an anode, an organic light emitting layer, and a cathode may be disposed in each of the plurality of sub-pixels, but is not limited thereto. In addition, the circuit for driving the plurality of sub-pixels may include a driving element, lines and the like. For example, the circuit may be formed of a thin film transistor, a storage capacitor, a gate line, a data line, and the like, but is not limited thereto.

The non-active area NA is an area in which an image is not displayed.

FIG. 3 illustrates that the non-active area NA surrounds the active area AA having a quadrangular shape, but shapes and arrangements of the active area AA and the non-active area NA are not limited to the example illustrated in FIG. 3.

The active area AA and the non-active area NA may have a shape suitable for designing an electronic apparatus on which the electroluminescent display device 100 is mounted. For example, another example shape of the active area AA may be a pentagonal shape, a hexagonal shape, a circular shape, or an oval shape.

Various lines and circuits for driving the organic light emitting element of the active area AA may be disposed in the non-active area NA. For example, in the non-active area NA, driver ICs such as a gate driver IC and a data driver IC or link lines for transmitting signals to the plurality of sub-pixels and circuits of the active area AA may be disposed, but are not limited thereto.

Meanwhile, left and right sides of FIG. 3 may be referred to as a gate pad portion on which the gate driver IC is disposed, and a lower side of FIG. 3 may be referred to as a data pad portion to which the flexible films are connected, but the present disclosure is not limited thereto.

The gate driver IC may be formed independently of the display panel 110 and may be configured in a form capable of being electrically connected to the display panel 110 in various manners, but may be configured in a method of a gate in panel (GIP) that is mounted in the display panel 110.

The electroluminescent display device may include various additional elements for generating various signals or driving the pixels in the active area AA. The additional elements for driving the pixels may include an inverter circuit, a multiplexer, an electro-static discharge (ESD) circuit, and the like. The electroluminescent display device may include additional elements associated with functions other than driving the pixels. For example, the electroluminescent display device may include additional elements that provide a touch sensing function, a user authentication function (e.g., fingerprint recognition), a multi-level pressure sensing function, a tactile feedback function, and the like. Such additional elements may be positioned in the non-active area NA and/or in an external circuit connected to a connection interface.

Although not illustrated, the flexible films are films for supplying signals to the plurality of sub-pixels and circuits of the active area AA, and may be electrically connected to the display panel 110. The flexible films may be disposed at one end of the non-active area NA of the display panel 110 and supply a power voltage, a data voltage and the like to the plurality of sub-pixels and circuits of the active area AA. For example, a driver IC such as a data driver IC may be disposed on the flexible films.

The printed circuit board may be disposed at one ends of the flexible films and connected to the flexible films. The printed circuit board is a component that supplies signals to the driver IC. The printed circuit board may supply various signals such as a driving signal and a data signal to the driver IC.

Meanwhile, excellent characteristics of the display panel are secured by using an oxide thin film transistor having characteristics of high mobility and low off current.

The electroluminescent display device includes a light emitting unit or structure formed of an organic layer for self-emission, and foreign materials may be generated due to mask pressing when the organic layer is deposited. Hydrogen diffuses through a seam of these foreign materials and moves to the oxide thin film transistor, leading to conductorization of the oxide thin film transistor. As a result, a white band defect may occur at an outside of the active area.

Accordingly, the present disclosure is characterized in that characteristics and reliability of the thin film transistor are improved by blocking an inflow of hydrogen into the oxide thin film transistor.

To this end, the first example embodiment of the present disclosure is characterized in that a hydrogen blocking layer 160 is formed between a GIP area GA and the active area AA to thereby block the inflow of hydrogen into the oxide thin film transistor. Accordingly, it is possible to improve the characteristics and reliability of the thin film transistor.

Specifically, referring to FIGS. 3 and 4, a substrate 111 may be divided into the active area AA and the non-active area NA outside the active area AA.

First and second thin film transistors 120a and 120b, the light emitting element 140, and an encapsulation layer 150 may be formed in the active area AA of the substrate 111.

The non-active area NA of the substrate 111 may include the GIP area GA.

Third and fourth thin film transistors 130a and 130b and the encapsulation layer 150 may be formed in the GIP area GA of the substrate 111.

The substrate 111 serves to support and protect components of the electroluminescent display device disposed thereon.

Recently, the flexible substrate 111 may be used with a flexible material having flexible characteristics such as plastic.

The flexible substrate 111 may be in a form of a film including one of the group consisting of a polyester-based polymer, a silicone-based polymer, an acrylic polymer, a polyolefin-based polymer, and a copolymer thereof.

Light blocking layers 125 and 135 may be disposed on the substrate 111.

The light blocking layers 125 and 135 may include a first light blocking layer 125 disposed in the active area AA and a second light blocking layer 135 disposed in the GIP area GA.

The light blocking layers 125 and 135 may be formed of a metallic material having a light blocking function in order to block external light from flowing into semiconductor layers 124a, 124b, and 134b.

The light blocking layers 125 and 135 may be formed in a single layer or multilayer structure formed of any one of opaque metals such as aluminum (Al), chromium (Cr), tungsten (W), titanium (Ti), nickel (Ni), neodymium (Nd), molybdenum (Mo) and copper (Cu), or alloys thereof.

A buffer layer 115a may be disposed over the substrate 111 on which the light blocking layers 125 and 135 are disposed.

The buffer layer 115a may be formed in a structure in which a single insulating layer or a plurality of insulating layers are stacked in order to block foreign materials including moisture, oxygen and the like, flowing from the substrate 111. That is, the buffer layer 115a may be formed of a single layer or multilayer structure of an inorganic insulating material such as silicon oxide (SiOx), silicon nitride (SiNx), or aluminum oxide (AlOx). The buffer layer 115a may be deleted according to types of the thin film transistors 120a, 120b, 130a, and 130b.

The buffer layer 115a may include contact holes exposing a portion of the light blocking layers 125 and 135.

Thin film transistors 120a, 120b, 130a, and 130b may be disposed on the buffer layer 115a.

The first thin film transistor 120a of the active area AA may be a switching transistor.

The switching transistor is turned on by a gate pulse supplied to a gate line and transmits a data voltage that is supplied to a data line to a gate electrode of a driving transistor.

To this end, the first thin film transistor 120a may include a first gate electrode 121a, a first source electrode 122a, a first drain electrode 123a, and a first semiconductor layer 124a.

The second thin film transistor 120b of the active area AA may be a driving transistor, and only a part of the driving transistor is illustrated in FIG. 4 for convenience. Other sensing transistors and compensation circuits may also be included in the electroluminescent display device 100.

The driving transistor may transmit a current that is transmitted through a power line to an anode 141 according to a signal received from the switching transistor, and may control light emission by the current transmitted to the anode 141.

To this end, the second thin film transistor 120b may include a second gate electrode, a second source electrode, a second drain electrode 123b, and a second semiconductor layer 124b.

Meanwhile, the third thin film transistor 130a of the GIP area GA may be a switching transistor.

For example, the third thin film transistor 130a may include a third gate electrode 131a, a third source electrode 132a, a third drain electrode 133a, and a third semiconductor layer 134a.

The fourth thin film transistor 130b of the GIP area GA may be a driving transistor, and only a part of the driving transistor is illustrated in FIG. 4 for convenience.

For example, the fourth thin film transistor 130b may include a fourth gate electrode, a fourth source electrode, a fourth drain electrode 133b, and a fourth semiconductor layer 134b.

The semiconductor layers 124a, 124b, 134a, and 134b may be formed of an oxide semiconductor. The oxide semiconductor has excellent mobility and uniformity properties. At this time, the oxide semiconductor may be formed of a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, a tin gallium zinc oxide (SnGaZnO)-based material, an aluminum gallium zinc oxide (AlGaZnO)-based material, and a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium oxide (InO)-based material, a tin oxide (SnO)-based material, an indium gallium oxide (InGaO)-based material, and a zinc oxide (ZnO)-based material. Composition ratios of the respective elements are not limited.

The semiconductor layers 124a, 124b, 134a, and 134b may include a source region including p-type or n-type impurities, a drain region, and a channel region between the source region and the drain region, and may further include a low concentration doped region between the source region and the drain region adjacent to the channel region, but the present disclosure is not limited thereto.

The source region and the drain region are regions doped with a high concentration of impurities, and may be connected to the source electrodes 122a and 132a and the drain electrodes 123a, 123b, 133a, and 133b of the thin film transistors 120a, 120b, 130a, and 130b, respectively.

As an impurity ion, the p-type impurity or n-type impurity may be used. The p-type impurity may be one of boron (B), aluminum (Al), gallium (Ga), and indium (In), and the n-type impurity may be one of phosphorus (P), arsenic (As), and antimony (Sb).

The channel region may be doped with the n-type impurity or p-type impurity according to an NMOS or PMOS transistor structure.

A second insulating layer 115c is a gate insulating layer composed of a single layer of silicon oxide (SiOx) or silicon nitride (SiNx) or multiple layers thereof, and may be disposed between the gate electrodes 121a and 131a and the semiconductor layers 124a, 124b, 134a, and 134b such that a current flowing through the semiconductor layers 124a, 124b, 134a, and 134b do not flow to the electrodes 121a and 131a. Silicon oxide is less ductile than metal, but has higher ductility to silicon nitride, so that it may be formed as a single layer or multiple layers according to characteristics thereof.

The gate electrodes 121a and 131a may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof, but the present disclosure is not limited thereto.

In addition, the source electrodes 122a and 132a and the drain electrodes 123a, 123b, 133a, and 133b may be composed of a single layer or multiple layers of a conductive metal such as copper (Cu), aluminum (Al), molybdenum (Mo), chromium (Cr), gold (Au), titanium (Ti), nickel (Ni), and neodymium (Nd), or alloys thereof, but the present disclosure is not limited thereto.

The second and fourth drain electrodes 123b and 133b may have one sides that are electrically connected to the second and fourth semiconductor layers 124b and 134b, respectively, and have the other sides electrically connected to the first and second light blocking layers 125 and 135, respectively.

Meanwhile, in the case of the first example embodiment of the present disclosure, as the hydrogen blocking layer 160 is disposed in planarization layers 115e and 115f between the GIP area GA and the active area AA, line connection between the GIP area GA and the active area AA may be performed by using a source/drain electrode layer. That is, for example, the first source electrode 122a of the active area AA may extend to the GIP area GA and may be electrically connected to the fourth drain electrode 133b, but the present disclosure is not limited thereto.

A passivation layer 115d may be disposed on the thin film transistors 120a, 120b, 130a, and 130b. The passivation layer 115d may be formed of an inorganic insulating layer such as silicon oxide (SiOx) or silicon nitride (SiNx).

The passivation layer 115d may serve to prevent unnecessary electrical connection between components disposed thereon and therebelow and to prevent contamination or damage from the outside, and may be omitted according to configurations and characteristics of the thin film transistors 120a, 120b, 130a, and 130b and the light emitting element 140.

The thin film transistors 120a, 120b, 130a, and 130b may be classified into an inverted staggered structure and a coplanar structure according to positions of components constituting the thin film transistors 120a, 120b, 130a, and 130b. In this case, for example, in a thin film transistor having an inverted staggered structure, a gate electrode may be positioned on opposite sides of a source electrode and a drain electrode with respect to a semiconductor layer. As shown in FIG. 4, in the thin film transistors 120a, 120b, 130a, 130b having a coplanar structure, the gate electrodes 121a and 131a may be positioned on the same sides of the source electrodes 122a and 132a and the drain electrodes 123a, 123b, 133a, and 133b.

FIG. 4 illustrates the thin film transistors 120a, 120b, 130a, and 130b having the coplanar structure, but the electroluminescent display device 100 according to the first example embodiment of the present disclosure may include a thin film transistor having the inverted staggered structure. In addition, some of the thin film transistors 120a, 120b, 130a, and 130b may have the coplanar structure, and some of the thin film transistors 120a, 120b, 130a, and 130b may have the inverted staggered structure.

The planarization layers 115e and 115f may be disposed on the thin film transistors 120a, 120b, 130a, and 130b to protect the thin film transistors 120a, 120b, 130a, and 130b and alleviate a step caused by them and to reduce parasitic capacitance occurring between the thin film transistors 120a, 120b, 130a, 130b, the gate line and the data line, and the light emitting element 140.

The planarization layers 115e and 115f may be formed of one or more materials among acrylic resin, epoxy resin, phenolic resin, polyamides resin, polyimides resin, unsaturated polyesters resin, polyphenylene resin, polyphenylene sulfides resin, and benzocyclobutene, but the present disclosure is not limited thereto.

In this case, a first planarization layer 115e may be disposed on the thin film transistors 120a, 120b, 130a, and 130b, and a second planarization layer 115f may be disposed on the first planarization layer 115e.

A buffer layer may be disposed on the first planarization layer 115e. The buffer layer may be composed of multiple layers of silicon oxide (SiOx) in order to protect components disposed on the first planarization layer 115e and may be omitted according to configurations and characteristics of the thin film transistors 120a, 120b, 130a, and 130b and the light emitting element 140.

First and second intermediate electrodes 126 and 136 may be connected to the thin film transistors 120a, 120b, 130a, and 130b through contact holes formed in the first planarization layer 115e. The first intermediate electrode 126 may be stacked to be connected to the second thin film transistor 120b, and the second intermediate electrode 136 may be stacked to be connected to the fourth thin film transistor 130b.

A passivation layer including an inorganic insulating layer such as silicon oxide (SiOx) or silicon nitride (SiNx) may be further disposed over the first planarization layer 115e and the intermediate electrodes 126 and 136. The passivation layer may serve to prevent unnecessary electrical connection between components and to prevent contamination or damage from the outside, and may be omitted according to configurations and characteristics of the thin film transistors 120a, 120b, 130a, and 130b and the light emitting element 140.

In this case, the light emitting element 140 including the anode 141, the light emitting unit 142, and the cathode 143 may be disposed on the second planarization layer 115f.

The anode 141 may be disposed on the second planarization layer 115f.

The anode 141 is an electrode serving to supply holes to the light emitting unit 142, and may be connected to the second thin film transistor 120b through a contact hole in the second planarization layer 115f.

The anode 141 may be formed of indium tin oxide (ITO), indium zinc oxide (IZO), or the like, which is a transparent conductive material, but is not limited thereto.

On the other hand, when the display panel 110 is a top emission type in which light is emitted to an upper portion thereof where the cathode 143 is disposed, it may further include a reflective layer such that the emitted light is reflected from the anode 141 and is smoothly emitted in a direction toward the upper portion where the cathode 143 is disposed.

That is, the anode 141 may be a two-layer structure in which a transparent conductive layer formed of a transparent conductive material and a reflective layer are sequentially stacked, or a three-layer structure in which a transparent conductive layer, a reflective layer and a transparent conductive layer are sequentially stacked. The reflective layer may be formed of silver (Ag) or an alloy including silver.

A hole H exposing a surface of the passivation layer 115d may be formed in the first and second planarization layers 115e and 115f between the GIP area GA and the active area AA. This is because the passivation layer 115d is formed of an inorganic layer. If the passivation layer 115d is formed of an organic layer, the hole H may be formed not only in the first and second planarization layers 115e and 115f but may also be formed in a portion of a thickness of the passivation layer 115d.

The hydrogen blocking layer 160 according to the first example embodiment of the present disclosure may be disposed on the hole H and the second planarization layer 115f between the GIP area GA and the active area AA.

In addition, the hole H and the hydrogen blocking layer 160 may be disposed to a perimeter of the active area AA, and may have, for example, a quadrangular frame shape, but is not limited thereto.

In FIG. 4, a case in which the hydrogen blocking layer 160 is deposited to have a predetermined or selected thickness on an inner surface of the hole H and a bank 115g fills an inside thereof is illustrated as an example, but the present disclosure is not limited thereto, and the hydrogen blocking layer 160 may be formed to fill the inside of the hole H. It should be understood that "fill" and "fills" includes the meaning of fills entirely or fills partially so that the combination of different layers will fill the hole, not just one layer alone.

Although one hydrogen blocking layer 160 is illustrated in FIG. 4, the present disclosure is not limited thereto, and a plurality of hydrogen blocking layers 160 may be disposed between the GIP area GA and the active area AA.

The hydrogen blocking layer 160 blocks an inflow of hydrogen into the first and second thin film transistors 120a and 120b of the active area AA and may function to improve characteristics and reliability of the first and second thin film transistors 120a and 120b.

The electroluminescent display device includes a light emitting unit formed of an organic layer for self-emission, and foreign materials may be generated due to mask pressing when the organic layer is deposited. Hydrogen inside the encapsulation layer diffuses through a mask-pressed portion and moves to the oxide thin film transistor along a plurality of organic layers such as the bank and the planarization layer, thereby inducing conductorization of the oxide thin film transistor. As a result, a white band defect may occur at the outside of the active area.

Figure 5:
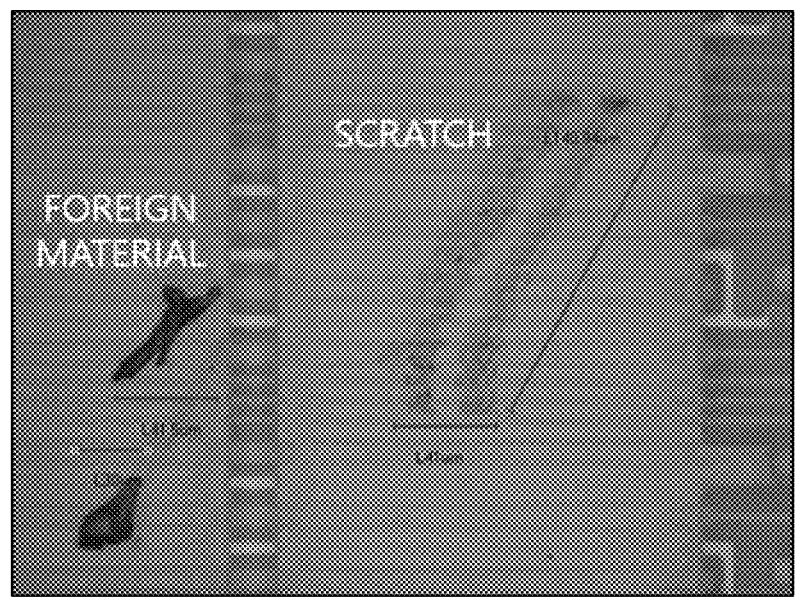
FIG. 5 is a photograph showing marks due to mask pressing.

FIG. 5 is a photograph showing marks due to mask pressing.

FIG. 5 is a micrograph that is obtained by observing a portion of the non-active area outside of the active area at a magnification of 50 times after the light emitting element is formed. FIG. 5 shows a part of the non-active area where an end of the light emitting unit is positioned.

Referring to FIG. 5, it can be seen that a plurality of foreign materials and scratches exist in the non-active area outside the active area.

As described above, it can be seen that foreign materials due to scratches are generated during mask alignment for depositing the organic layer of the light emitting unit in a chamber. Hydrogen generated in the encapsulation layer may penetrate into a seam due to the foreign materials and may diffuse into the active area along the organic layers such as the bank and the planarization layer. The hydrogen diffusing into the active area may cause damage to an underlying oxide semiconductor layer over time and cause a negative shift in a threshold voltage Vth. Accordingly, a white band defect may occur along an edge of the active area.

Referring back to FIGS. 3 and 4, the present disclosure is characterized by forming a blocking structure capable of blocking hydrogen diffusion from the outside of the active area AA to the active area AA. Accordingly, as hydrogen diffusion from the outside of the active area AA to the active area AA is blocked, conductorization of the oxide thin film transistors 120a and 120b is prevented, so that white band unevenness may be improved.

To this end, the present disclosure is characterized in that, first, after forming the hole H as shown in FIG. 4 with a photomask when the plurality of organic layers of the bank 115g and the planarization layers 115e and 115f are deposited, a material capable of absorbing hydrogen such as Ti is deposited thereon so that the hydrogen blocking layer 160 is formed in the hole H.

Here, Ti is a metal having a hydrogen adsorption capability and can effectively block hydrogen in structures of the encapsulation layer 150 and the oxide thin film transistors 120a and 120b.

It is preferable to form the hydrogen blocking layer 160 before the light emitting unit 142 is formed. Since an organic layer may be deposited in the hole H when the light emitting unit 142 is formed, it is preferable to deposit Ti of the hydrogen blocking layer 160 before the organic layer is deposited.

In addition, it is preferable to position an end of the light emitting unit 142 at an outside of the hole H and the hydrogen blocking layer 160. That is, the hole H and the hydrogen blocking layer 160 may be positioned closer to the active area AA than the end of the light emitting unit 142. This is because, when the light emitting unit 142 is formed, pressing of an alignment mask is caused around the end of the light emitting unit 142.

In addition, the hydrogen blocking layer 160 may more effectively protect the oxide thin film transistors 120a and 120b and may be electrically separated from components formed in the same or different layers in order to fully perform a hydrogen adsorption function. The hydrogen blocking layer 160 may be in a state in which current is not supplied or a signal is not transmitted because it is not electrically connected to other electrodes or lines.

In addition, the hydrogen blocking layer 160 may be formed to cross (e.g., extend into, through or past) at least two organic layers in a vertical direction, in order to block hydrogen flowing in a lateral or diagonal direction of the active area AA. In order to block a hydrogen inflow path in the vertical direction, the hydrogen blocking layer 160 may have a shape in cross-section such as a U-shape, a T-shape, a W-shape, or a reverse tapered shape. Accordingly, the hydrogen blocking layer 160 may be referred to as a hydrogen blocking vertical wall or a hydrogen blocking wall.

A material constituting the hydrogen blocking layer 160 may include Sc, V, Pd, Nb, Zr, Y, Ta, Ce, La, Sm, U, and the like, that have excellent hydrogen adsorption capability in addition to Ti. For reference, a hydrogen solubility of TiH is higher than those of AlH, NiH, AgH, CuH and ZnH.

Looking at a metal hydride, for example, hydride of Ti is $TiH_{2.00}$, which means that two hydrogens H can be stored in one Ti, and it can be seen that hydrogen adsorption capability thereof is a million times higher than $AlH_{<2.5 \times 10^{-8}}$.

It can be seen that hydrides of Sc, V, Pd, Nb, Zr, Y, Ta, Ce, La, Sm, and U are $ScH_{>1.86}$, $VH_{1.00}$, $PdH_{0.724}$, $NbH_{1.1}$, $ZrH_{>1.70}$, $YH_{>2.85}$, $TaH_{0.79}$, $CeH_{>2.5}$, $LaH_{>2.03}$, $SmH_{3.00}$, $UH_{>3.00}$, respectively.

The bank 115g may be disposed on the anode 141, the hydrogen blocking layer 160, and the second planarization layer 115f.

The bank 115g that is disposed on the anode 141 and the second planarization layer 115f may have openings that overlap respective sub-pixels, and may partition an area that actually emits light, that is, an emission area.

After a photoresist is formed on the anode 141, the bank 115g may be formed through a photolithography process. The photoresist refers to a photosensitive resin of which solubility in a developer is changed by an action of light, and a specific pattern can be obtained by exposing and developing the photoresist. The photoresist can be classified into a positive type photoresist and a negative type photoresist. In this case, the positive photoresist refers to a photoresist of which solubility in a developer for an exposed portion is increased by exposure, and when the positive photoresist is developed, a pattern in which the exposed portion is removed is obtained. The negative photoresist refers to a photoresist of which solubility in a developer for an exposed portion is lowered by exposure, and when the negative photoresist is developed, a pattern in which an unexposed portion is removed is obtained.

A fine metal mask (FMM), which is a deposition mask, may be used to form the light emitting unit 142 of the light emitting element 140.

In addition, in order to prevent damage that may be caused by contact with the deposition mask disposed on the bank 115g and to maintain a constant distance between the bank 115g and the deposition mask, a spacer formed of one of benzocyclobutene, photoacrylic, and polyimide, which is a transparent organic material, may be disposed on the bank 115g.

The bank 115g may include an opening exposing a portion of the anode 141 by removing a portion of the bank 115g in the emission area.

The bank 115g may be disposed to extend to a portion of the non-active area NA, but is not limited thereto.

The light emitting unit 142 may be disposed between the anode 141 and the cathode 143.

The light emitting unit 142 which serves to emit light, may include at least one layer of a hole injection layer (HIL), a hole transport layer (HTL), a light emitting layer, an electron transport layer (ETL), and an electron injection layer (EIL), and some components may be omitted according to a structure or characteristics of the electroluminescent display device. Here, as the light emitting layer, an electroluminescent layer and an inorganic light emitting layer may also be applied.

The hole injection layer is disposed on the anode 141 and serves to facilitate hole injection.

The hole transport layer is disposed on the hole injection layer and serves to smoothly transfer holes to the light emitting layer.

The light emitting layer is disposed on the hole transport layer, and includes a material capable of emitting light of a specific color to thereby emit light of a specific color. In addition, a light emitting material may be formed using a phosphorescent material or a fluorescent material.

The electron injection layer may be further disposed on the electron transport layer. The electron injection layer is an organic layer that facilitates injection of electrons from the cathode 143, and may be omitted according to the structure and characteristics of the electroluminescent display device.

Meanwhile, by further disposing an electron blocking layer or a hole blocking layer for blocking a flow of holes or electrons at a position adjacent to the light emitting layer, it is possible to prevent a phenomenon in which the electrons move from the light emitting layer when injected into the light emitting layer and pass through the hole transport layer adjacent thereto or a phenomenon in which the holes move from the light emitting layer when injected into the light emitting layer and pass through the electron transport layer adjacent thereto, so that luminous efficiency can be improved.

The light emitting unit 142 may be disposed to extend to a portion of the non-active area NA, but is not limited thereto.

The cathode 143 is disposed on the light emitting unit 142 and serves to supply electrons to the light emitting unit 142. Since the cathode 143 needs to supply electrons, it may be formed of a metallic material such as magnesium, silver-magnesium, which is a conductive material having a low work function, but is not limited thereto.

On the other hand, when the display panel 110 is a top emission type, the cathode 143 may be a transparent conductive oxide, such as indium tin oxide (ITO), indium zinc oxide (IZO), indium tin zinc oxide (ITZO), zinc oxide (ZnO) and tin oxide (TO).

The cathode 143 may be disposed to extend to a portion of the non-active area NA to cover the light emitting unit 142, but is not limited thereto.

The encapsulation layer 150 may be disposed on the cathode 143.

Specifically describing the encapsulation layer 150, a capping layer is formed on an upper surface of the substrate 110 on which the light emitting element 140 is formed, and a primary protective layer 150a, an organic layer 150b, and a secondary protective layer 150c are sequentially formed to constitute the encapsulation layer 150 serving as an encapsulation means. However, the number of inorganic layers and organic layers constituting the encapsulation layer 150 is not limited thereto.

In the case of the primary protective layer 150a, since it is formed of an inorganic insulating layer, stack coverage thereof is not good due to a lower step. However, since the organic layer 150b serves to perform planarization, the secondary protective layer 150c is not affected by a step due to a lower layer. In addition, since a thickness of the organic layer 150b formed of a polymer is sufficiently thick, cracks caused by foreign materials can be compensated.

On a front surface of the substrate 110 including the secondary protective layer 150c, a multilayered protective film may be positioned to face it for encapsulation, and an adhesive which is transparent and has adhesive properties may be interposed between the encapsulation layer 150 and the protective film.

A polarizing plate for preventing reflection of light incident from the outside may be attached onto the protective film, but is not limited thereto.

Meanwhile, as described above, the hydrogen blocking layer of the present disclosure may be formed to fill the inside of the hole, which will be described with reference to FIG. 6.

Figure 6:
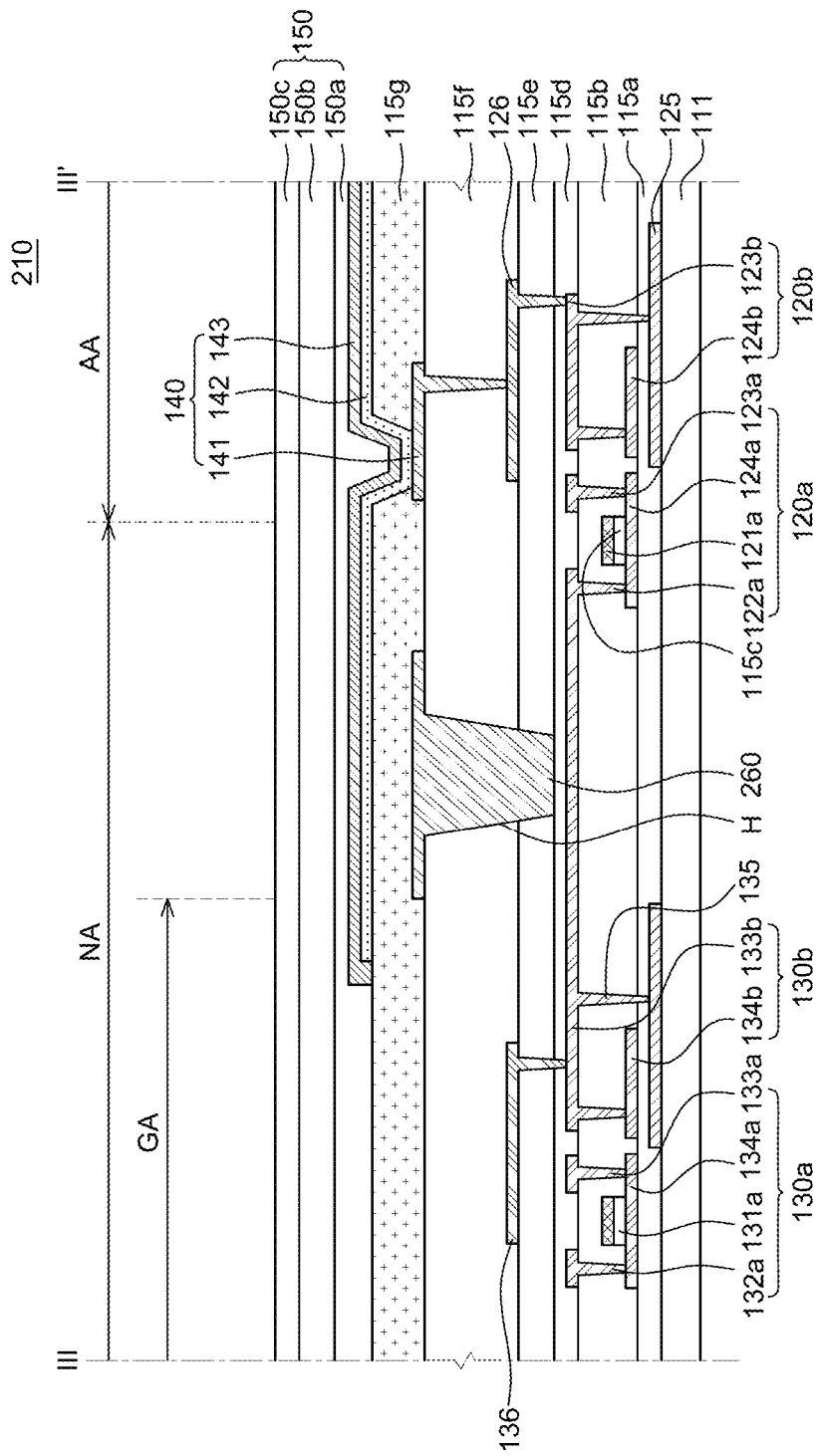
FIG. 6 is a cross-sectional view of a display panel according to a second example embodiment of the present disclosure.

FIG. 6 is a cross-sectional view of a display panel according to a second example embodiment of the present disclosure.

A display panel 210 according to the second example embodiment of the present disclosure shown in FIG. 6 is different from the display panel 110 of FIG. 4 only in terms of a configuration of a hydrogen blocking layer 260, and other configurations thereof are substantially the same, and thus, a duplicate description will be omitted. The same reference numerals are used for the same components.

Referring to FIG. 6, as described above, a hole H exposing the surface of the passivation layer 115d in the first and second planarization layers 115e and 115f between the GIP area GA and the active area AA may be formed. If the passivation layer 115d is formed of an organic layer, the hole H may be formed not only in the first and second planarization layers 115e and 115f but may also be formed in a portion of the thickness of the passivation layer 115d.

The hydrogen blocking layer 260 according to the second example embodiment of the present disclosure may be disposed on the second planarization layer 115f as well as the inside of the hole H. That is, the hydrogen blocking layer 260 may be disposed to fill the inside of the hole H of the second planarization layer 115f between the GIP area GA and the active area AA.

In this case, the hole H and the hydrogen blocking layer 260 may be disposed to surround a perimeter of the active area AA, and may have, for example, a quadrangular frame shape, but is not limited thereto.

In addition, it is preferable to position the end of the light emitting unit 142 at an outside of the hole H and the hydrogen blocking layer 260. That is, the hole H and the hydrogen blocking layer 260 may be positioned closer to the active area AA than the end of the light emitting unit 142.

The hydrogen blocking layer 260 blocks an inflow of hydrogen into the first and second thin film transistors 120a and 120b of the active area AA and may function to improve characteristics and reliability of the first and second thin film transistors 120a and 120b.

A material constituting the hydrogen blocking layer 260 may include Sc, V, Pd, Nb, Zr, Y, Ta, Ce, La, Sm, U, and the like, that have excellent hydrogen adsorption capability in addition to Ti.

Although one hydrogen blocking layer 260 is illustrated in FIG. 6, the present disclosure is not limited thereto, and a plurality of hydrogen blocking layers 260 may be disposed between the GIP area GA and the active area AA.

Meanwhile, the hole and the hydrogen blocking layer of the present disclosure may be formed not only in the planarization layer but may also be formed in the bank, which will be described with reference to FIG. 7.

Figure 7:
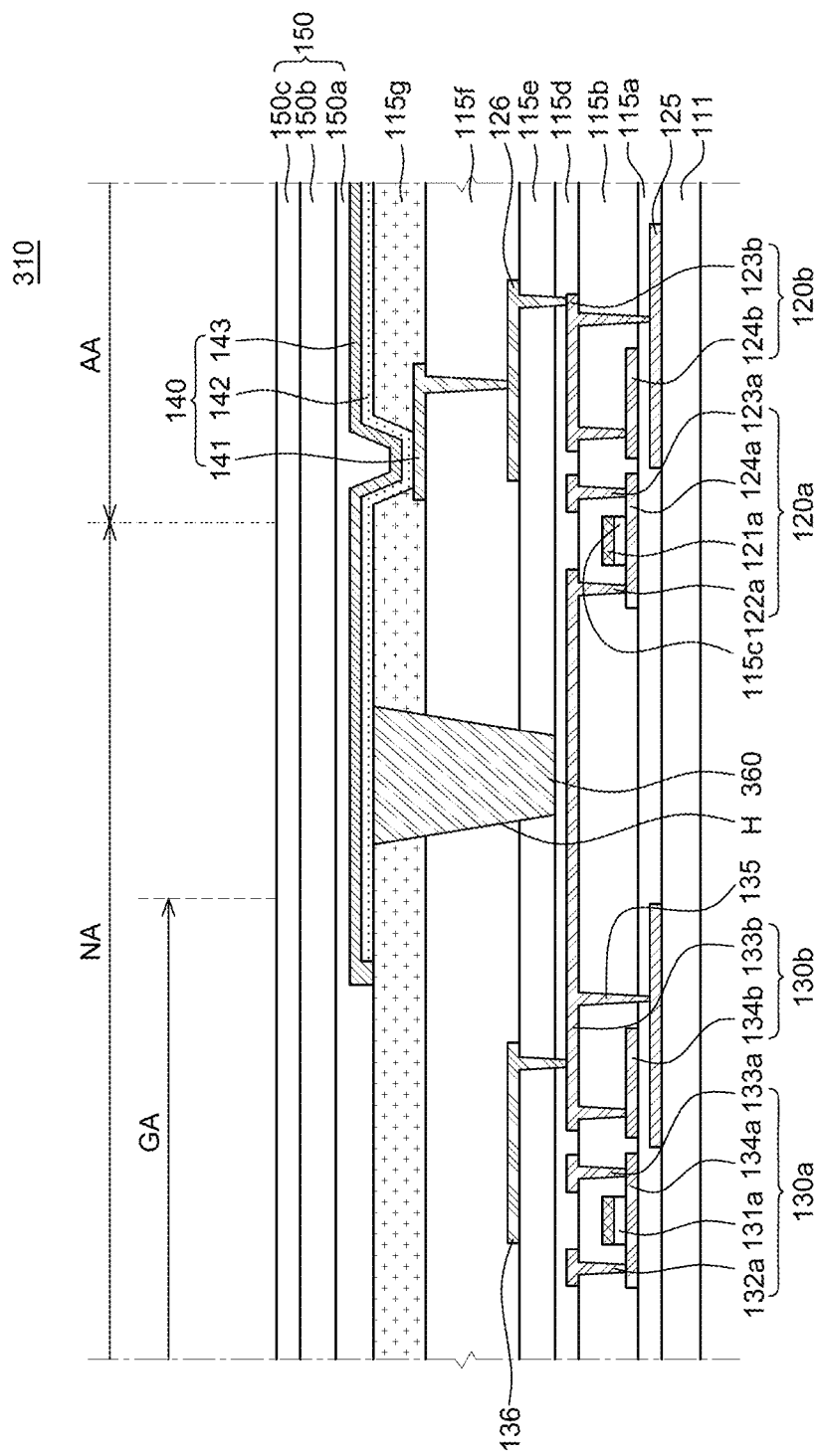
FIG. 7 is a cross-sectional view of a display panel according to a third example embodiment of the present disclosure.

FIG. 7 is a cross-sectional view of a display panel according to a third example embodiment of the present disclosure.

A display panel 310 according to the third example embodiment of the present disclosure shown in FIG. 7 is different from the display panel 210 of FIG. 6 only in terms of configurations of a hole H and a hydrogen blocking layer 360, and other configurations thereof are substantially the same, and thus, a duplicate description will be omitted. The same reference numerals are used for the same components.

Referring to FIG. 7, a hole H according to the third example embodiment of the present disclosure may be formed to expose the surface of the passivation layer 115d in the bank 115g as well as the first and second planarization layers 115e and 115f between the GIP area GA and the active area AA. If the passivation layer 115d is formed of an organic layer, the hole H may be formed not only in the bank 115g and the first and second planarization layers 115e and 115f, but may also be formed in a portion of the thickness of the passivation layer 115d.

The hydrogen blocking layer 360 according to the third example embodiment of the present disclosure may be disposed on the bank 115g as well as the inside of the hole H. That is, the hydrogen blocking layer 360 may be disposed to fill the inside of the hole H of the bank 115g and the second planarization layer 115f between the GIP area GA and the active area AA.

In this case, the hole H and the hydrogen blocking layer 360 may be disposed to surround a perimeter of the active area AA, and may have, for example, a quadrangular frame shape, but is not limited thereto.

In addition, it is preferable to position the end of the light emitting unit 142 at an outside of the hole H and the hydrogen blocking layer 360. That is, the hole H and the hydrogen blocking layer 360 may be positioned closer to the active area AA than the end of the light emitting unit 142.

The hydrogen blocking layer 360 blocks an inflow of hydrogen into the first and second thin film transistors 120a and 120b of the active area AA and may function to improve characteristics and reliability of the first and second thin film transistors 120a and 120b.

A material constituting the hydrogen blocking layer 360 may include Sc, V, Pd, Nb, Zr, Y, Ta, Ce, La, Sm, U, and the like, that have excellent hydrogen adsorption capability in addition to Ti.

Although one hydrogen blocking layer 360 is illustrated in FIG. 7, the present disclosure is not limited thereto, and a plurality of hydrogen blocking layers 360 may be disposed between the GIP area GA and the active area AA.

Meanwhile, the hydrogen blocking layer of the present disclosure may be disposed only up to the second planarization layer. In this case, line connection between the GIP area and the active area may be performed by using an intermediate electrode layer, which will be described in detail with reference to FIG. 8.

Figure 8:
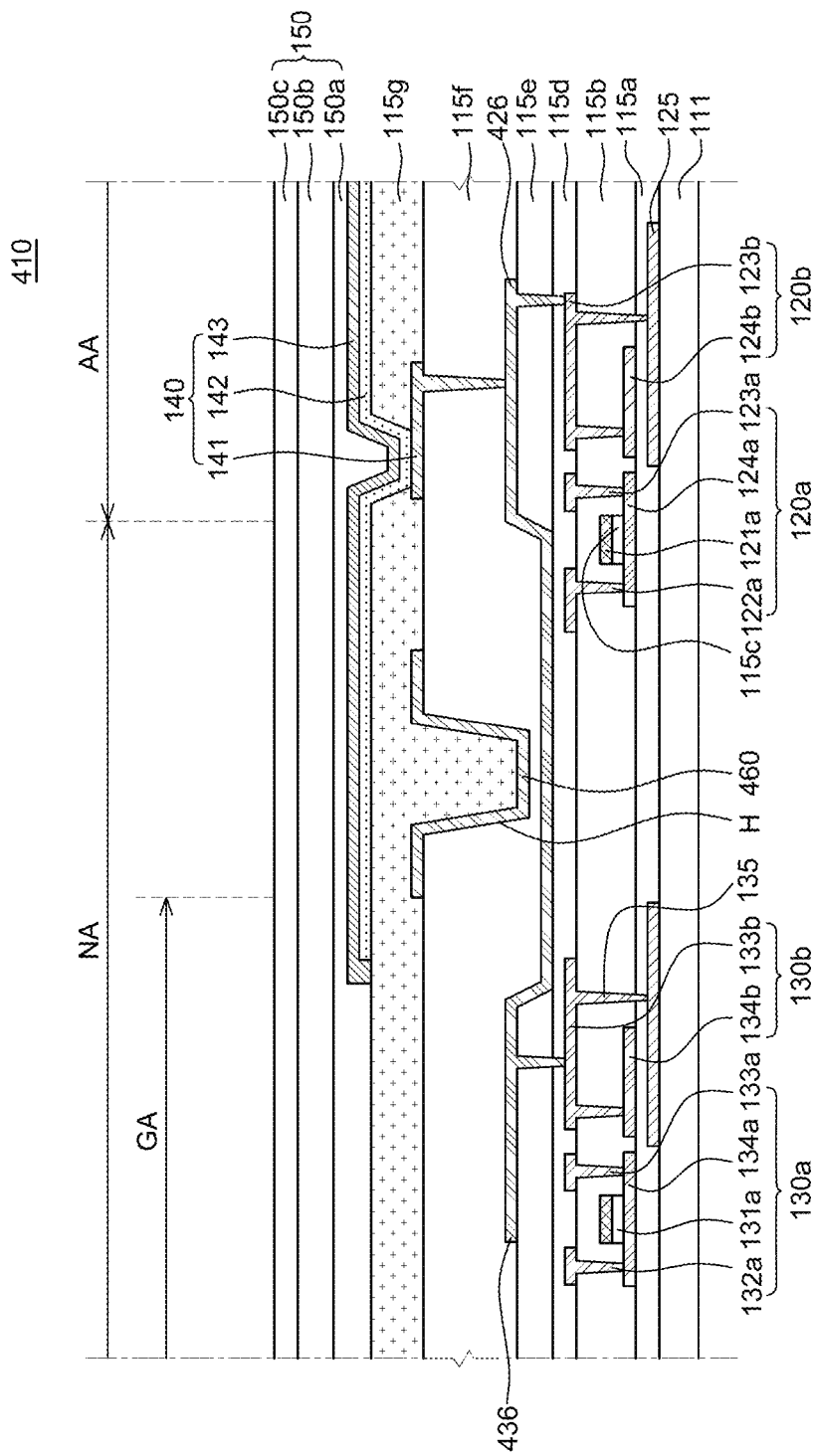
FIG. 8 is a cross-sectional view of a display panel according to a fourth example embodiment of the present disclosure.

FIG. 8 is a cross-sectional view of a display panel according to a fourth example embodiment of the present disclosure.

A display panel 410 according to the fourth example embodiment of the present disclosure shown in FIG. 8 is different from the display panel 110 of FIG. 4 only in terms of a hydrogen blocking layer 460 and a configuration of line connection between the GIP area GA and the active area AA, and other configurations thereof are substantially the same, and thus, a duplicate description will be omitted. The same reference numerals are used for the same components.

Referring to FIG. 8, the fourth example embodiment of the present disclosure is characterized in that a hole H is formed in the second planarization layer 115f between the GIP area GA and the active area AA. In this case, the hole H may be configured such that a portion of a thickness of the second planarization layer 115f is removed, but is not limited thereto. The hole H may be configured such that an overall thickness of the second planarization layer 115f is removed, so that a surface of the first planarization layer 115e may be exposed. In addition, the hole H may be formed not only in the second planarization layer 115f but may also be formed in the bank 115g on an upper portion thereof.

In FIG. 8, a case in which the hydrogen blocking layer 460 is deposited to have a predetermined or selected thickness on an inner surface of the hole H and the bank 115g fills an inside thereof is illustrated as an example, but the present disclosure is not limited thereto, and the hydrogen blocking layer 160 may be formed to fill the inside of the hole H.

In this case, the hole H and the hydrogen blocking layer 460 may be disposed to surround a perimeter of the active area AA, and may have, for example, a quadrangular frame shape, but is not limited thereto.

In addition, it is preferable to position the end of the light emitting unit 142 at an outside of the hole H and the hydrogen blocking layer 460. That is, the hole H and the hydrogen blocking layer 460 may be positioned closer to the active area AA than the end of the light emitting unit 142.

The hydrogen blocking layer 460 blocks an inflow of hydrogen into the first and second thin film transistors 120*a* and 120*b* of the active area AA and may function to improve characteristics and reliability of the first and second thin film transistors 120*a* and 120*b*.

A material constituting the hydrogen blocking layer 460 may include Sc, V, Pd, Nb, Zr, Y, Ta, Ce, La, Sm, U, and the like, that have excellent hydrogen adsorption capability in addition to Ti.

Although one hydrogen blocking layer 460 is illustrated in FIG. 8, the present disclosure is not limited thereto, and a plurality of hydrogen blocking layers 460 may be disposed between the GIP area GA and the active area AA.

In the fourth example embodiment of the present disclosure, as the hole H is disposed in the second planarization layer 115*f* between the GIP area GA and the active area AA, line connection between the GIP area GA and the active area AA may be performed by using an intermediate electrode layer rather than a source/drain electrode layer. That is, for example, a first intermediate electrode 426 of the active area AA may extend to the GIP area GA and may be electrically connected to a second intermediate electrode 436, but is not limited thereto.

Meanwhile, the hole and the hydrogen blocking layer of the present disclosure may be provided in plural number, which will be described with reference to FIGS. 9 and 10.

Figure 9:
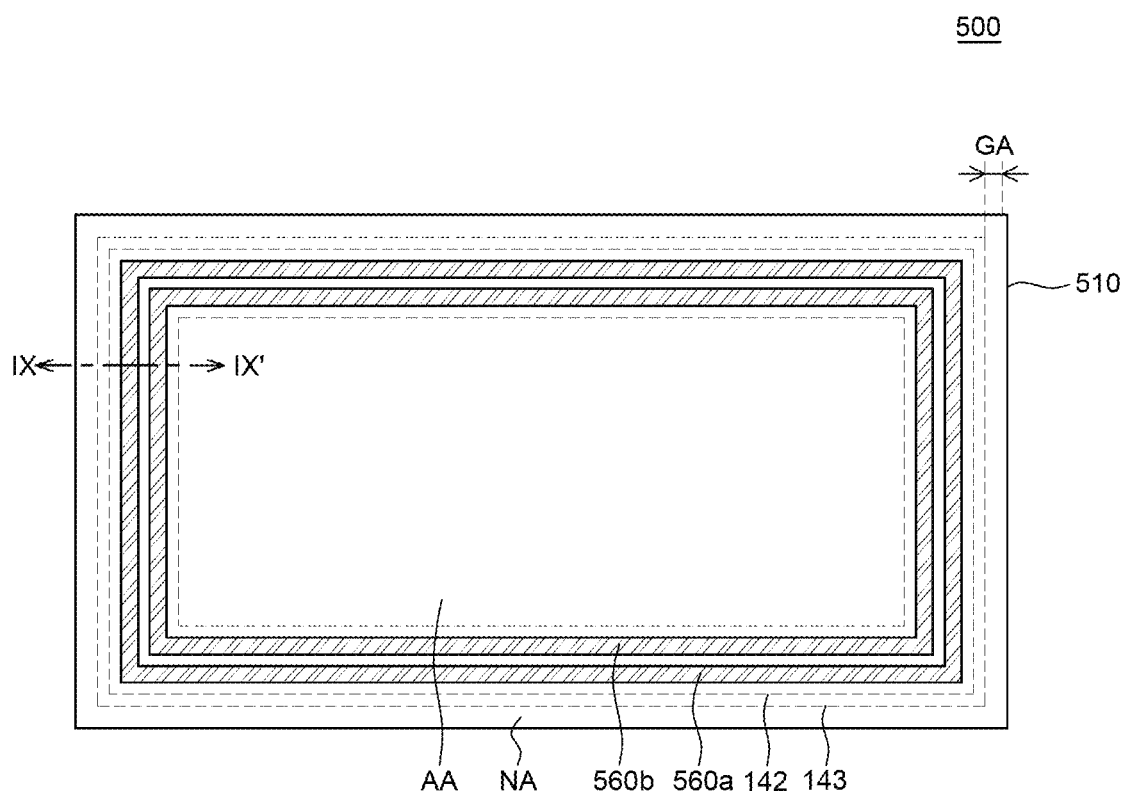
FIG. 9 is a plan view of an electroluminescent display device according to a fifth example embodiment of the present disclosure.

FIG. 9 is a plan view of an electroluminescent display device according to a fifth example embodiment of the present disclosure.

Figure 10:
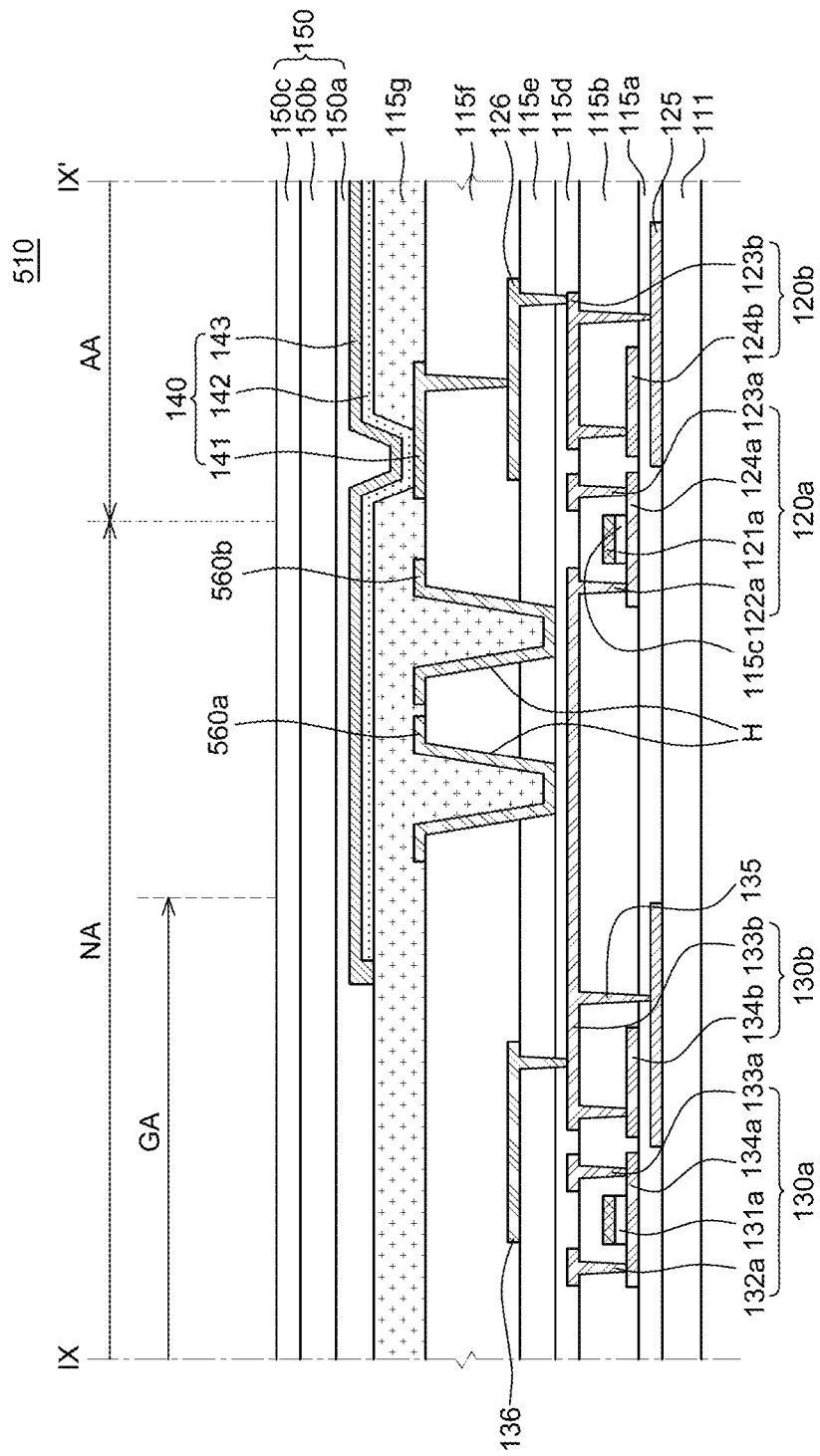
FIG. 10 is a cross-sectional view taken along line IX-IX' of FIG. 9.

FIG. 10 is a cross-sectional view taken along line IX-IX' of FIG. 9.

FIG. 10 illustrates a cross-section of a display panel 510 according to a fifth example embodiment including a portion of a gate in panel (GIP).

The display panel 510 according to the fifth example embodiment of the present disclosure shown in FIGS. 9 and 10 is different from the display panel 110 of FIGS. 3 and 4 only in terms of the number of hydrogen blocking layers 560*a* and 560*b* and a hole H, and other configurations thereof are substantially the same, and thus, a duplicate description will be omitted. The same reference numerals are used for the same components.

Referring to FIGS. 9 and 10, an electroluminescence display device 500 according to the fifth example embodiment of the present disclosure may include a display panel 510 including an active area AA and a non-active area NA.

In this case, as described above, a plurality of holes H exposing a surface of the passivation layer 115*d* in the first and second planarization layers 115*e* and 115*f* between the GIP area GA and the active area AA may be formed. If the passivation layer 115*d* is formed of an organic layer, the plurality of holes H may be formed not only in the first and second planarization layers 115*e* and 115*f* but may also be formed in a portion of the thickness of the passivation layer 115*d*.

Each of a plurality of the hydrogen blocking layers 560*a* and 560*b* according to the fifth example embodiment of the present disclosure may be disposed on the second planarization layer 115*f* as well as insides of the plurality of holes H. That is, the hydrogen blocking layers 560*a* and 560*b* are deposited to have a predetermined or selected thickness on inner surfaces of the plurality of holes H of the second planarization layer 115*f* between the GIP area GA and the active area AA, and the bank 115*g* may fill insides of the plurality of holes H. However, the present disclosure is not limited thereto, and the hydrogen blocking layers 560*a* and 560*b* may be formed to fill the inside of the hole H. That is, each of the plurality of hydrogen blocking layers 560*a* and 560*b* may be disposed to fill the insides of the plurality of holes H of the second planarization layer 115*f* between the GIP area GA and the active area AA.

The plurality of hydrogen blocking layers 560*a* and 560*b* may include a first hydrogen blocking layer 560*a* positioned at an outside thereof and a second hydrogen blocking layer 560*b* positioned at an inside thereof, but the present disclosure is not limited thereto.

In this case, the plurality of holes H and the plurality of hydrogen blocking layers 560*a* and 560*b* may be disposed to surround a perimeter of the active area AA, and may have, for example, a quadrangular frame shape, but is not limited thereto.

In addition, it is preferable to position the end of the light emitting unit 142 at an outside of the plurality of holes H and the plurality of hydrogen blocking layers 560*a* and 560*b*. That is, the plurality of holes H and the plurality of hydrogen blocking layers 560*a* and 560*b* may be positioned closer to the active area AA than the end of the light emitting unit 142.

The plurality of holes H and the plurality of hydrogen blocking layers 560*a* and 560*b* block an inflow of hydrogen into the first and second thin film transistors 120*a* and 120*b* of the active area AA, and may function to improve characteristics and reliability of the first and second thin film transistors 120*a* and 120*b*.

A material constituting the hydrogen blocking layers 560*a* and 560*b* may include Sc, V, Pd, Nb, Zr, Y, Ta, Ce, La, Sm, U, and the like, that have excellent hydrogen adsorption capability in addition to Ti.

Meanwhile, in a case in which the end of the light emitting unit is positioned in a middle of the plurality of hydrogen blocking layers, hydrogen inflow into the oxide thin film transistor of the GIP area as well as the oxide thin film transistor of the active area can be blocked, which will be described with reference to FIGS. 11 and 12.

Figure 11:
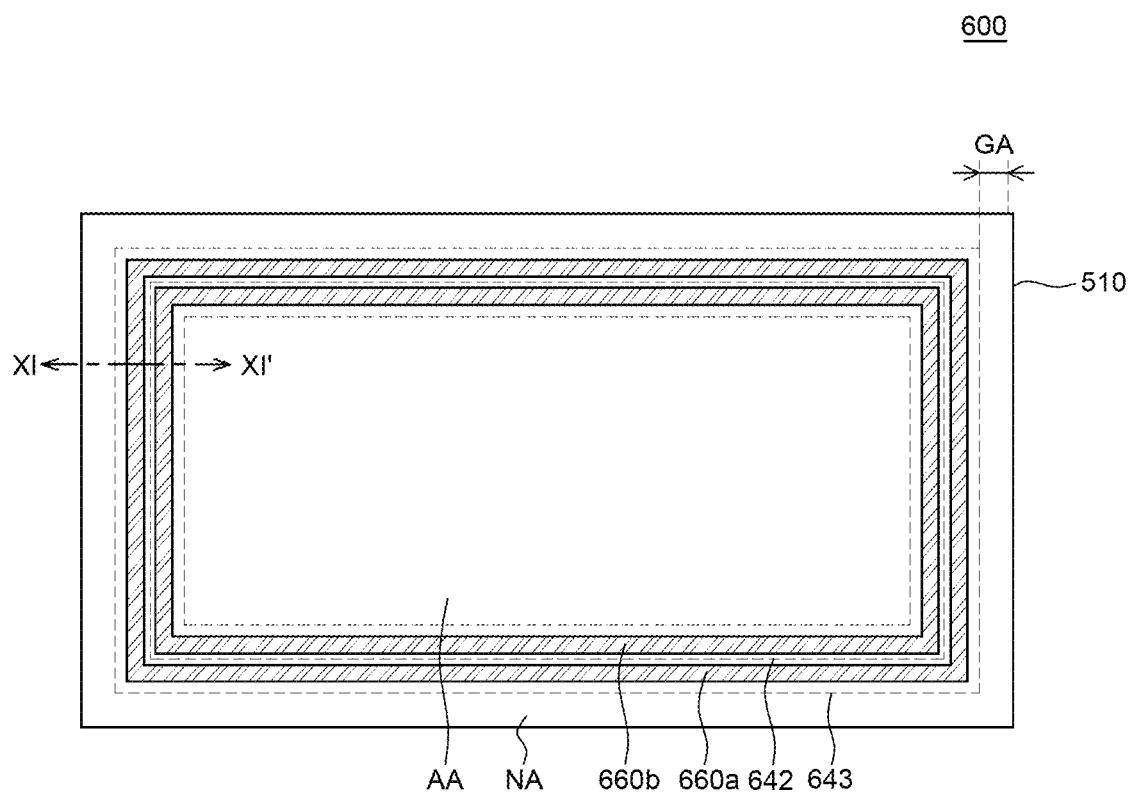
FIG. 11 is a plan view of an electroluminescent display device according to a sixth example embodiment of the present disclosure.

FIG. 11 is a plan view of an electroluminescent display device according to a sixth example embodiment of the present disclosure.

Figure 12:
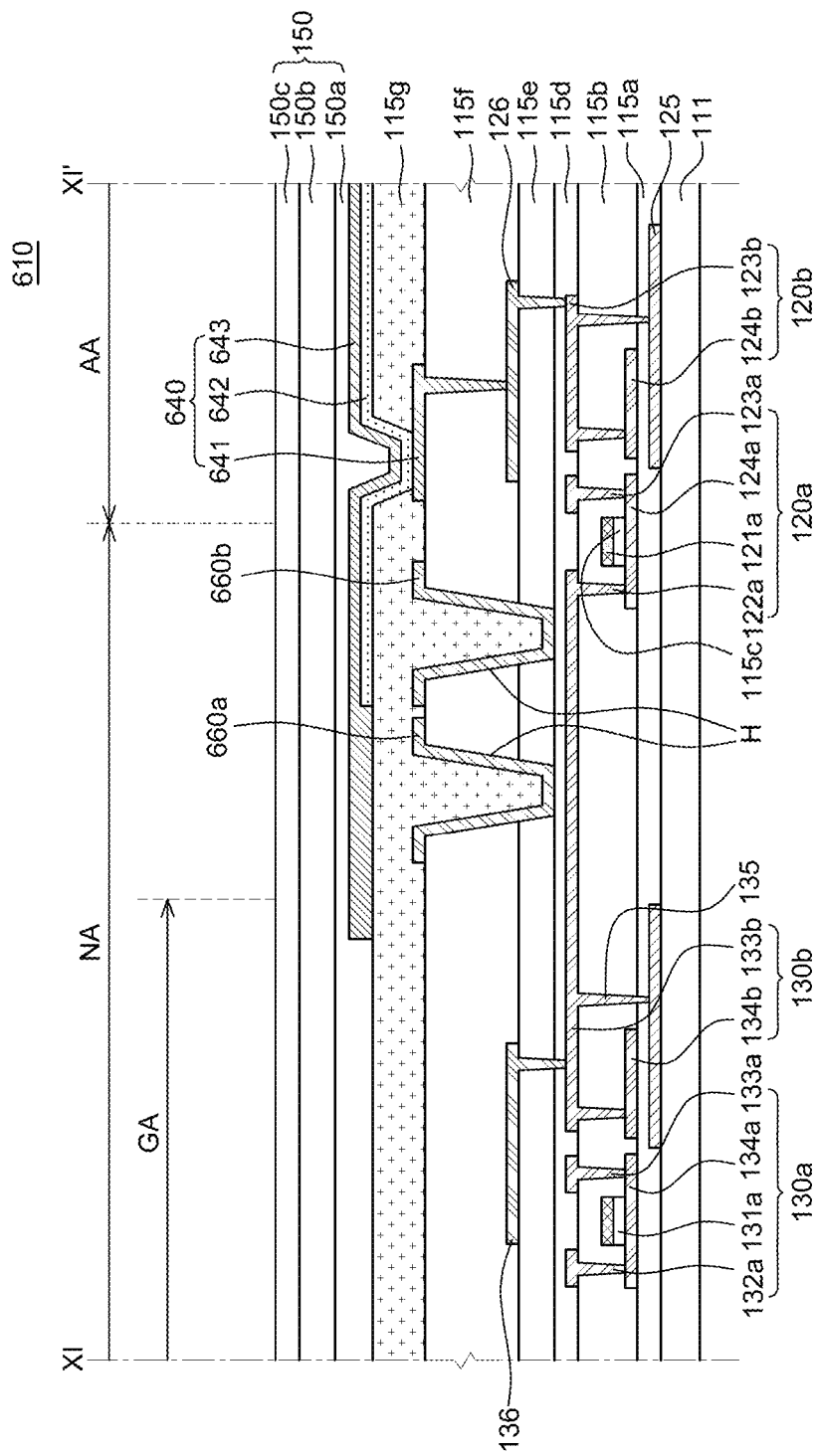
FIG. 12 is a cross-sectional view taken along line XI-XI' of FIG. 11.

FIG. 12 is a cross-sectional view taken along line XI-XI' of FIG. 11.

FIG. 12 illustrates a cross-section of a display panel 610 according to a sixth example embodiment of the present disclosure including a part of a gate in panel (GIP).

The display panel 610 according to the sixth example embodiment of the present disclosure shown in FIGS. 11 and 12 is different from the display panel 510 of FIGS. 9 and 10 only in terms of configurations of a light emitting unit 642 and a cathode 643 and other configurations thereof are substantially the same, and thus, a duplicate description will be omitted. The same reference numerals are used for the same components.

Referring to FIGS. 11 and 12, an electroluminescence display device 600 according to the sixth example embodiment of the present disclosure may include a display panel 610 including an active area AA and a non-active area NA.

In this case, as described above, a plurality of holes H exposing a surface of the passivation layer 115*d* in the first and second planarization layers 115*e* and 115*f* between the GIP area GA and the active area AA may be formed. If the passivation layer 115*d* is formed of an organic layer, the plurality of holes H may be formed not only in the first and second planarization layers 115*e* and 115*f* but may also be formed in a portion of the thickness of the passivation layer 115*d*.

Each of a plurality of hydrogen blocking layers 660*a* and 660*b* according to the sixth example embodiment of the present disclosure may be disposed on the second planarization layer 115*f* as well as insides of the plurality of holes H. That is, the hydrogen blocking layers 660*a* and 660*b* are deposited to have a predetermined or selected thickness on inner surfaces of the plurality of holes H of the second planarization layer 115*f* between the GIP area GA and the active area AA, and the bank 115*g* may fill insides of the plurality of holes H. However, the present disclosure is not limited thereto, and the hydrogen blocking layers 660*a* and 660*b* may be formed to fill the inside of the hole H. That is, each of the plurality of hydrogen blocking layers 660*a* and 660*b* may be disposed to fill the insides of the plurality of holes H of the second planarization layer 115*f* between the GIP area GA and the active area AA.

The plurality of hydrogen blocking layers 660*a* and 660*b* may include a first hydrogen blocking layer 660*a* positioned at an outside thereof and a second hydrogen blocking layer 660*b* positioned at an inside thereof, but the present disclosure is not limited thereto.

In this case, the plurality of holes H and the plurality of hydrogen blocking layers 660*a* and 660*b* may be disposed to surround a perimeter of the active area AA, and may have, for example, a quadrangular frame shape, but is not limited thereto.

In addition, the sixth example embodiment of the present disclosure is characterized in that an end of the light emitting unit 642 is positioned in a middle of the plurality of holes H and the plurality of hydrogen blocking layers 660*a* and 660*b*. That is, the end of the light emitting unit 642 according to the sixth example embodiment of the present disclosure may be positioned between the first hydrogen blocking layer 660*a* and the second hydrogen blocking layer 660*b*. In this case, it is possible to block an inflow of hydrogen into the first and second thin film transistors 120*a* and 120*b* of the active area AA as well as the third and fourth thin film transistors 130*a* and 130*b* of the GIP area GA. Accordingly, characteristics and reliability of the third and fourth thin film transistors 130*a* and 130*b* of the GIP area GA as well as the first and second thin film transistors 120*a* and 120*b* of the active area AA can be improved.

A material constituting the hydrogen blocking layers 660*a* and 660*b* may include Sc, V, Pd, Nb, Zr, Y, Ta, Ce, La, Sm, U, and the like, that have excellent hydrogen adsorption capability in addition to Ti.

The example embodiments of the present disclosure can also be described as follows:

According to an aspect of the present disclosure, there is provided an electroluminescent display device. The electroluminescent display device includes a substrate divided into an active area and a non-active area, an oxide thin film transistor disposed on the substrate, an inorganic layer disposed on the oxide thin film transistor, an organic layer disposed on the inorganic layer, at least one hole disposed in the organic layer of the non-active area, a hydrogen blocking layer disposed on the organic layer and an inner surface of the hole and a light emitting element disposed on the organic layer and including an anode, a light emitting unit, and a cathode.

The electroluminescent display device may further include a bank disposed on the organic layer to partition an emission area.

The hole may be configured by removing only a portion of a thickness of the organic layer.

The hydrogen blocking layer may be disposed to have a predetermined or selected thickness on an inner surface of the hole, and the bank may fill a remaining inside of the hole.

The hydrogen blocking layer may be disposed on the organic layer and an inside of the hole.

The hole may be disposed in the organic layer and the bank, and the hydrogen blocking layer may fill an inside of the hole.

An end of the light emitting unit may be positioned outside the hydrogen blocking layer.

The cathode may be disposed to extend to the non-active area to cover the end of the light emitting unit.

The hydrogen blocking layer may be disposed to surround a perimeter of the active area.

The hydrogen blocking layer may include a plurality of hydrogen blocking layers.

An end of the light emitting unit may be positioned in a middle of the plurality of hydrogen blocking layers.

The plurality of hydrogen blocking layers may include a first hydrogen blocking layer positioned at an outside thereof and a second hydrogen blocking layer positioned at an inside thereof.

An end of the light emitting unit may be positioned between the first hydrogen blocking layer and the second hydrogen blocking layer.

The hydrogen blocking layer may be made of one of Ti, Sc, V, Mn, Fe, Pd, Nb, Zr, Y, Ta, Ce, La, Sm, and U.

The non-active area may include a gate in panel (GIP) area.

The hydrogen blocking layer may be disposed in the non-active area between the GIP area and the active area.

Line connection between the GIP area and the active area may be performed by using a source/drain electrode layer under the inorganic layer.

Line connection between the GIP area and the active area may be performed by using a connection electrode layer on the inorganic layer.

According to another aspect of the present disclosure, there is provided an electroluminescent display device. The electroluminescent display device includes a substrate divided into an active area and a non-active area, an oxide thin film transistor disposed on the substrate in the active area, an inorganic layer disposed on the oxide thin film transistor, an organic layer disposed on the inorganic layer, a hydrogen blocking layer disposed in the organic layer of the non-active area, a light emitting element disposed on the organic layer and including an anode, a light emitting unit, and a cathode and an encapsulation layer disposed on the light emitting element, wherein the hydrogen blocking layer is positioned inwardly from an end of the light emitting unit to block hydrogen that is generated in the encapsulation layer from diffusing toward the active area through the end of the light emitting unit.

The hydrogen blocking layer may be made of any one of Ti, Sc, V, Mn, Fe, Pd, Nb, Zr, Y, Ta, Ce, La, Sm, and U.

The hydrogen blocking layer may be electrically separated from components of the same layer or different layers.

The organic layer may be composed of a plurality of organic layers, and the hydrogen blocking layer may be configured to cross the at least two organic layers in a vertical direction.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a substrate including an active area and a non-active area;
an oxide thin film transistor disposed on the substrate;
an inorganic layer disposed on the oxide thin film transistor;
an organic layer disposed on the inorganic layer;
at least one hole disposed in the organic layer of the non-active area;
a hydrogen blocking layer disposed on the organic layer and an inner surface of the hole; and
a light emitting element disposed on the organic layer and including an anode, a light emitting structure, and a cathode,
wherein:
the light emitting structure extends from the active area into the non-active area; and
in the non-active area, an end of the light emitting structure is positioned outside the hydrogen blocking layer.

2. The electroluminescent display device of claim 1, further comprising:
a bank disposed on the organic layer to partition an emission area.

3. The electroluminescent display device of claim 2, wherein the hole has depth less than a thickness of the organic layer.

4. The electroluminescent display device of claim 2, wherein the hydrogen blocking layer is disposed to have a selected thickness on an inner surface of the hole, and the bank fills a remaining portion of the hole.

5. The electroluminescent display device of claim 2, wherein the hydrogen blocking layer is disposed on the organic layer and an inside of the hole.

6. The electroluminescent display device of claim 2, wherein the hole is disposed in the organic layer and the bank, and the hydrogen blocking layer fills an inside of the hole.

7. The electroluminescent display device of claim 1, wherein the cathode is disposed to extend to the non-active area to cover the end of the light emitting structure.

8. The electroluminescent display device of claim 1, wherein the hydrogen blocking layer is disposed adjacent to a perimeter of the active area.

9. The electroluminescent display device of claim 1, wherein the hydrogen blocking layer includes a plurality of hydrogen blocking layers.

10. The electroluminescent display device of claim 9, wherein an end of the light emitting structure is positioned between the plurality of hydrogen blocking layers.

11. The electroluminescent display device of claim 9, wherein the plurality of hydrogen blocking layers include a first hydrogen blocking layer and a second hydrogen blocking layer, the first hydrogen blocking layer being positioned outside the second hydrogen blocking layer.

12. The electroluminescent display device of claim 11, wherein an end of the light emitting structure is positioned between the first hydrogen blocking layer and the second hydrogen blocking layer.

13. The electroluminescent display device of claim 1, wherein the hydrogen blocking layer includes one of Ti, Sc, V, Mn, Fe, Pd, Nb, Zr, Y, Ta, Ce, La, Sm, and U.

14. The electroluminescent display device of claim 1, wherein the non-active area includes a gate in panel (GIP) area.

15. The electroluminescent display device of claim 14, wherein the hydrogen blocking layer is disposed in the non-active area between the GIP area and the active area.

16. The electroluminescent display device of claim 14, wherein line connection between the GIP area and the active area is positioned in a source/drain electrode layer under the inorganic layer.

17. The electroluminescent display device of claim 14, wherein line connection between the GIP area and the active area is positioned in a connection electrode layer on the inorganic layer.

18. An electroluminescent display device, comprising:
a substrate including an active area and a non-active area;
an oxide thin film transistor disposed on the substrate in the active area;
an inorganic layer disposed on the oxide thin film transistor;
an organic layer disposed on the inorganic layer;
a hydrogen blocking layer disposed in the organic layer of the non-active area;
a light emitting element disposed on the organic layer and including an anode, a light emitting structure, and a cathode; and
an encapsulation layer disposed on the light emitting element,
wherein:
the light emitting structure extends from the active area into the non-active area; and
in the non-active area, the hydrogen blocking layer is positioned inwardly from an end of the light emitting structure and blocks hydrogen that is generated in the encapsulation layer from diffusing toward the active area through the end of the light emitting structure.

19. The electroluminescent display device of claim 18, wherein the hydrogen blocking layer includes any one of Ti, Sc, V, Mn, Fe, Pd, Nb, Zr, Y, Ta, Ce, La, Sm, and U.

20. The electroluminescent display device of claim 18, wherein the hydrogen blocking layer is electrically separated from components of the same layer thereof or different layers.

21. The electroluminescent display device of claim 20, wherein the organic layer includes a plurality of organic layers, and the hydrogen blocking layer extends into the at least two organic layers in a vertical direction.

* * * * *